(12) United States Patent
Barron et al.

(10) Patent No.: US 7,734,466 B2
(45) Date of Patent: Jun. 8, 2010

(54) REDUCED COMPLEXITY RECURSIVE LEAST SQUARE LATTICE STRUCTURE ADAPTIVE FILTER BY MEANS OF LIMITED RECURSION OF THE BACKWARD AND FORWARD ERROR PREDICTION SQUARES

(75) Inventors: David L. Barron, Scottsdale, AZ (US); Kyle K. Iwai, Chandler, AZ (US); James B. Piket, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 1097 days.

(21) Appl. No.: 11/399,907

(22) Filed: Apr. 7, 2006

(65) Prior Publication Data

US 2006/0288066 A1 Dec. 21, 2006

Related U.S. Application Data

(60) Provisional application No. 60/692,345, filed on Jun. 20, 2005, provisional application No. 60/692,236, filed on Jun. 20, 2005, provisional application No. 60/692,347, filed on Jun. 20, 2005.

(51) Int. Cl.
*G10L 15/00* (2006.01)
*G10L 19/00* (2006.01)
*G10L 11/00* (2006.01)
*G10L 15/06* (2006.01)

(52) U.S. Cl. ............ 704/244; 704/200.1; 704/200; 375/232

(58) Field of Classification Search ............ 704/200, 704/200.1, 244; 375/232
See application file for complete search history.

(56) References Cited

U.S. PATENT DOCUMENTS

| | | | | |
|---|---|---|---|---|
| 4,179,709 A | * | 12/1979 | Workman | 375/240.2 |
| 4,521,907 A | * | 6/1985 | Amir et al. | 704/262 |
| 4,972,483 A | * | 11/1990 | Carey | 704/222 |
| 4,979,211 A | * | 12/1990 | Benvenuto et al. | 704/251 |
| 5,157,690 A | * | 10/1992 | Buttle | 375/232 |
| 5,307,375 A | * | 4/1994 | Wu et al. | 375/236 |
| 5,353,307 A | | 10/1994 | Lester et al. | |
| 5,353,372 A | * | 10/1994 | Cook et al. | 704/207 |
| 5,418,714 A | | 5/1995 | Sarver | |
| 5,432,816 A | | 7/1995 | Gozzo | |
| 5,432,821 A | | 7/1995 | Polydoros et al. | |
| 5,434,948 A | * | 7/1995 | Holt et al. | 704/220 |
| 5,513,215 A | | 4/1996 | Marchetto et al. | |
| 5,539,858 A | * | 7/1996 | Sasaki et al. | 704/212 |
| 5,615,208 A | | 3/1997 | Hagmanns | |

(Continued)

OTHER PUBLICATIONS

Cioffi, J., "The Fast Householder Filters RLS Adaptive Filter," IEEE, pp. 1619-1622 (1990).

(Continued)

*Primary Examiner*—Richemond Dorvil
*Assistant Examiner*—Eric Yen
(74) *Attorney, Agent, or Firm*—Nathan O. Greene; Brinks Hofer Gilson & Lione (57) ABSTRACT

A method for reducing a computational complexity of an m-stage adaptive filter is provided by updating recursively forward and backward error prediction square terms for a first portion of a length of the adaptive filter, and keeping the updated forward and backward error prediction square terms constant for a second portion of the length of the adaptive filter.

11 Claims, 7 Drawing Sheets

U.S. PATENT DOCUMENTS

| | | | |
|---|---|---|---|
| 5,649,012 A * | 7/1997 | Gupta et al. | 379/406.09 |
| 5,657,350 A * | 8/1997 | Hofmann | 375/241 |
| 5,809,086 A | 9/1998 | Ariyavisitakul | |
| 5,809,463 A * | 9/1998 | Gupta et al. | 704/233 |
| 5,844,951 A | 12/1998 | Proakis et al. | |
| 6,353,629 B1 | 3/2002 | Pal | |
| 6,381,272 B1 * | 4/2002 | Ali | 375/233 |
| 6,442,274 B1 * | 8/2002 | Sugiyama | 379/406.08 |
| 6,445,692 B1 | 9/2002 | Tsatsanis | |
| 6,643,676 B1 | 11/2003 | Slock et al. | |
| 6,658,071 B1 | 12/2003 | Cheng | |
| 6,675,148 B2 * | 1/2004 | Hardwick | 704/500 |
| 6,678,230 B2 * | 1/2004 | Miyashita et al. | 369/53.16 |
| 6,760,374 B1 | 7/2004 | Tapp et al. | |
| 6,763,064 B1 | 7/2004 | Graf et al. | |
| 6,801,565 B1 | 10/2004 | Bottomley et al. | |
| 6,810,073 B1 | 10/2004 | Karlsson | |
| 6,947,550 B2 * | 9/2005 | Xiong | 379/406.05 |
| 6,963,833 B1 * | 11/2005 | Singhal | 704/207 |
| 7,027,504 B2 | 4/2006 | Yousef et al. | |
| 7,113,540 B2 | 9/2006 | Yousef et al. | |
| 7,170,924 B2 | 1/2007 | Corbaton et al. | |
| 7,231,234 B2 * | 6/2007 | Awad et al. | 455/570 |
| 7,277,472 B2 * | 10/2007 | Li et al. | 375/148 |
| 7,299,251 B2 | 11/2007 | Skidmore et al. | |
| 7,530,955 B2 | 5/2009 | Diab et al. | |
| 2001/0005822 A1 * | 6/2001 | Fujii et al. | 704/200 |
| 2001/0021940 A1 * | 9/2001 | Fujii et al. | 708/318 |
| 2002/0147584 A1 * | 10/2002 | Hardwick | 704/229 |
| 2003/0023650 A1 | 1/2003 | Papathanasiou | |
| 2005/0075866 A1 * | 4/2005 | Widrow | 704/211 |
| 2005/0123129 A1 * | 6/2005 | Awad et al. | 379/406.01 |
| 2006/0288064 A1 * | 12/2006 | Barron et al. | 708/300 |
| 2006/0288067 A1 * | 12/2006 | Barron et al. | 708/323 |

OTHER PUBLICATIONS

Marple, S. Lawrence, "Two-Dimensional Lattice Linear Prediction Parameter Estimation Method and Fast Algorithm," 7(6) IEEE Signal Processing Letters 164-168 (Jun. 2000).

Meng, Julian, "A Modified Recursive Least Squares Adaptive Lattice Filter for Narrowband Interference Rejection," IEEE, pp. 969-972 (May 2003).

Merched, Ricardo, et al., "Extended Fast Fixed Order RLS Adaptive Filters," IEEE, pp. II-665 to II-668 (2001).

Merched, Ricardo, et al., "Extended Fast Fixed-Order RLS Adaptive Filters," 49(12) IEEE Transactions on Signal Processing 3015-3031 (Dec. 2001).

International Search Report and Written Opinion for International Application No. PCT/US2006/022286, mailed Mar. 24, 2008 (8 pages).

* cited by examiner

PRIOR ART

Backwards Error Prediction Squares

REDUCED COMPLEXITY RECURSIVE LEAST SQUARE LATTICE STRUCTURE ADAPTIVE FILTER BY MEANS OF LIMITED RECURSION OF THE BACKWARD AND FORWARD ERROR PREDICTION SQUARES

RELATED APPLICATIONS

This application claims the benefit of U.S. Provisional Application No. 60/692,345, filed Jun. 20, 2005, U.S. Provisional Application No. 60/692,236, filed Jun. 20, 2005, and U.S. Provisional Application No. 60/692,347, filed Jun. 20, 2005, all of which are incorporated herein by reference.

FIELD OF THE INVENTION

The present invention relates in general to adaptive filters and, more particularly to a reduced complexity recursive least square lattice structure adaptive filter.

BACKGROUND

Adaptive filters are found in a wide range of applications and come in a wide variety of configurations each with distinctive properties. A particular configuration chosen may depend on specific properties needed for a target application. These properties, which include among others, rate of convergence, mis-adjustment, tracking, and computational requirements, are evaluated and weighed against each other to determine the appropriate configuration for the target application.

Of particular interest when choosing an adaptive filter configuration for use in a non-stationary signal environment are the rate of convergence, the mis-adjustment and the tracking capability. Good tracking capability is generally a function of the convergence rate and mis-adjustment properties of a corresponding algorithm. However, these properties may be contradictory in nature, in that a higher convergence rate will typically result in a higher convergence error or mis-adjustment of the resulting filter.

A recursive least squares (RLS) algorithm is generally a good tool for the non-stationary signal environment due to its fast convergence rate and low level of mis-adjustment. One particular form of the RLS algorithm is a recursive least squares lattice (RLSL) algorithm. The initial RLSL algorithm was introduced by Simon Haykin, and can be found in the "Adaptive Filter Theory Third Edition" book. The RLS class of adaptive filters exhibit fast convergence rates and are relatively insensitive to variations in an eigenvalue spread. Eigenvalues are a measure of correlation properties of the reference signal and the eigenvalue spread is typically defined as a ratio of the highest eigenvalue to the lowest eigenvalue. A large eigenvalue spread significantly slows down the rate of convergence for most adaptive algorithms.

However, the RLS algorithm typically requires extensive computational resources and can be prohibitive for embedded systems. Accordingly, there is a need to provide a mechanism by which the computational requirements of an RLSL structure adaptive filter are reduced.

Illustrative and exemplary embodiments of the invention are described in further detail below with reference to and in conjunction with the figures.

DETAILED DESCRIPTION

A method for reducing a computational complexity of an m-stage adaptive filter is provided by updating recursively forward and backward error prediction square terms for a first portion of a length of the adaptive filter, and keeping the updated forward and backward error prediction square terms constant for a second portion of the length of the adaptive filter. The present invention is defined by the appended claims. This description addresses some aspects of the present embodiments and should not be used to limit the claims.

FIGS. 1a-1d illustrate four schematic diagrams of filter circuits 90 employing an adaptive filter 10. The filter circuits 90 in general and the adaptive filter 10 may be constructed in any suitable manner. In particular, the adaptive filter 10 may be formed using electrical components such as digital and analog integrated circuits. In other examples, the adaptive filter 10 is formed using a digital signal processor (DSP) operating in response to stored program code and data maintained in a memory. The DSP and memory may be integrated in a single component such as an integrated circuit, or may be maintained separately. Further, the DSP and memory may be components of another system, such as a speech processing system or a communication device.

In general, an input signal u(n) is supplied to the filter circuit 90 and to the adaptive filter 10. As shown, the adaptive filter 10 may be configured in a multitude of arrangements between a system input and a system output. It is intended that the improvements described herein may be applied to the widest variety of applications for the adaptive filter 10.

Figure 1A:
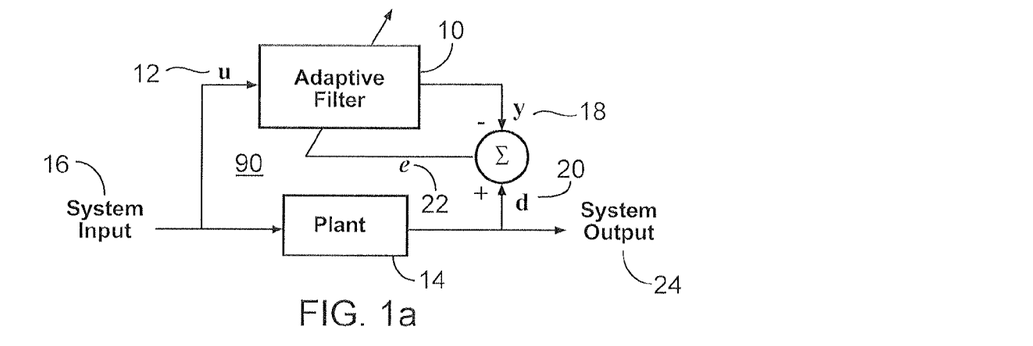
FIGS. 1a-1d illustrate four schematic diagrams of applications employing an adaptive filter.

In FIG. 1a, an identification type application of the adaptive filter 10 is shown. In FIG. 1a, the filter circuit 90 includes an adaptive filter 10, a plant 14 and a summer. The plant 14 may be any suitable signal source being monitored. In this arrangement, the input signal u(n) received at an input 12 and is supplied to the adaptive filter 10 and to a signal processing plant 14 from a system input 16. A filtered signal y(n) 18 produced at an output by adaptive filter 10 is subtracted from a signal d(n) 20 supplied by plant 14 at an output to produce an error signal e(n) 22. The error signal e(n) 22 is fed back to the adaptive filter 10. In this identification type application, signal d(n) 20 also represents an output signal of the system output 24.

Figure 1B:
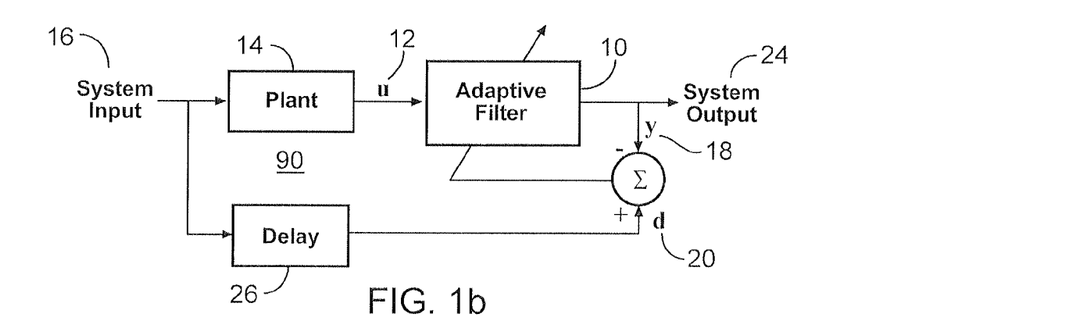

In FIG. 1b, an inverse modeling type application of the adaptive filter 10 is shown. In FIG. 1b, the filter circuit 100 includes an adaptive filter 10, a plant 14, a summer and a delay process 26. In this arrangement, an input signal originating from system input 16 is transformed into the input signal u(n) 12 of the adaptive filter 10 by plant 14, and converted into signal d(n) 20 by a delay process 26. Filtered signal y(n) 18 of the adaptive filter 10 is subtracted from signal d(n) 20 to produce error signal e(n) 22, that is fed back to the adaptive filter 10.

Figure 1C:
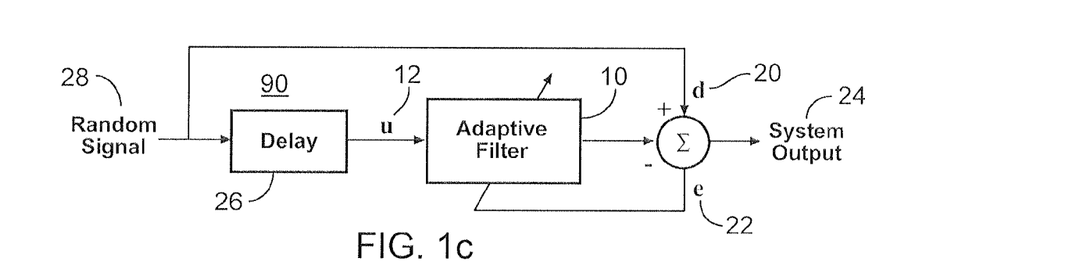

In FIG. 1c, a prediction type application of the adaptive filter 10 is shown. In FIG. 1c, the filter circuit 100 includes an adaptive filter 10, a summer and a delay process 26. In this arrangement, adaptive filter 10 and delay process 26 are arranged in series between system input 16, now supplying a random signal input 28, and the system output 24. As shown, the random signal input 28 is subtracted as signal d(n) 20 from filtered signal y(n) 18 to produce error signal e(n) 22, that is fed back to the adaptive filter 10. In this prediction type application, error signal e(n) 22 also represents the output signal supplied by system output 24.

Figure 1D:
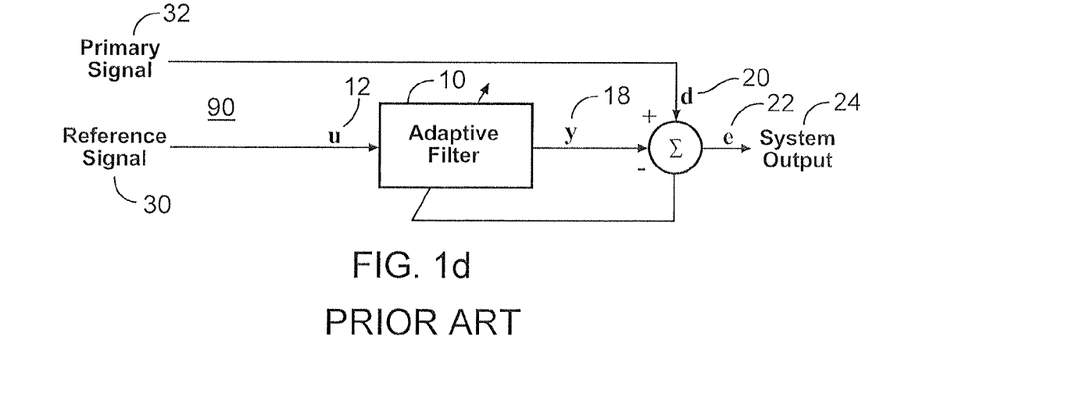

In FIG. 1d, an interference canceling type application of the adaptive filter 10 is shown. In FIG. 1d, the filter circuit 100 includes an adaptive filter 10 and a summer. In this arrangement, a reference signal 30 and a primary signal 32 are provided as input signal u(n) 12 and as signal d(n) 20, respectively. As shown, primary signal 32 is subtracted as signal d(n) 20 from filtered signal y(n) 18 to produce error signal e(n) 22, that is fed back to the adaptive filter 10. In this interference canceling type application, error signal e(n) 22 also represents the output signal supplied the system output 24.

Figure 2:
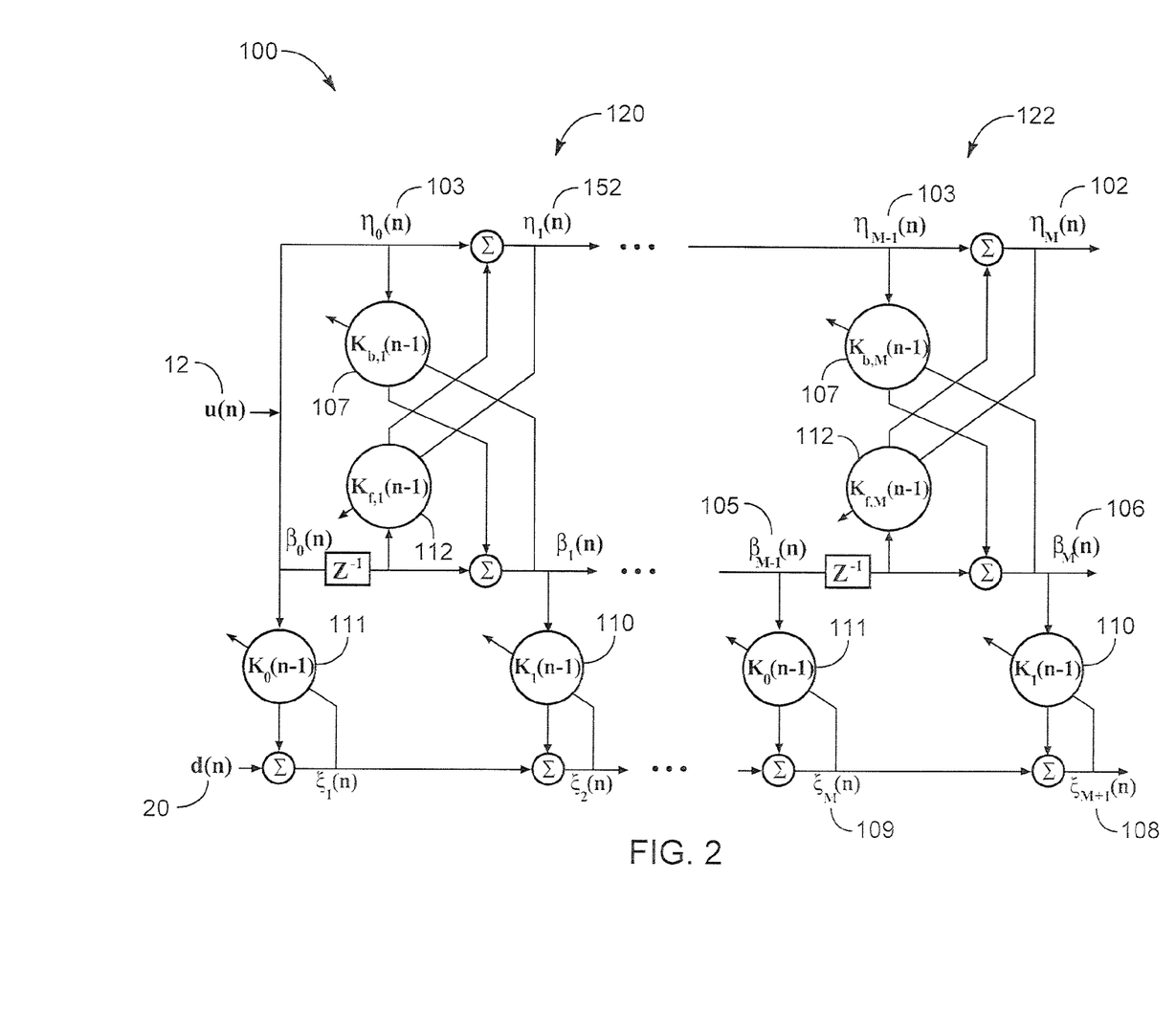
FIG. 2 is a block diagram of a RLSL structure adaptive filter according to the invention.

Now referring to FIG. 2, a block diagram of an m-stage RLSL structure adaptive filter (RLSL) 100 is shown. The adaptive filter 100 includes a plurality of stages including a first stage 120 and an m-th stage 122. Each stage (m) may be characterized by a forward prediction error $\eta_m(n)$ 102, a forward prediction error $\eta_{m-1}(n)$ 103, a forward reflection coefficient $K_{f,m-1}(n-1)$ 104, a delayed backward prediction error $\beta_{m-1}(n)$ 105, a backward prediction error $\beta(n)$ 106, a backward reflection coefficient $K_{b,m-1}(n-1)$ 107, an a priori estimation error backward $\xi_m(n)$ 108, an a priori estimation error backward $\xi_{m-1}(n)$ 109 and a joint process regression coefficient $K_{m-1}(n-1)$ 110. This m-stage adaptive RLSL filter 100 is shown with filter coefficients updates indicated by arrows drawn through each coefficient block. These filter coefficient updates are recursively computed for each stage (m) of a filter length of the RLSL 100 and for each sample time (n) of the input signal u(n) 12.

An RLSL algorithm for the RLSL 100 is defined below in terms of Equation 1 through Equation 8.

$$F_{m-1}(n) = \lambda F_{m-1}(n-1) + \gamma_{m-1}(n-1)|\eta_{m-1}(n)|^2 \quad \text{Equation 1}$$

$$B_{m-1}(n-1) = \lambda B_{m-1}(n-2) + \gamma_{m-1}(n-1)|\beta_{m-1}(n-1)|^2 \quad \text{Equation 1}$$

$$\eta_m(n) = \eta_{m-1}(n) + K_{f,m}(n-1)\beta_{m-1}(n-1) \quad \text{Equation 2}$$

$$\beta_m(n) = \beta_{m-1}(n-1) + K_{b,m}(n-1)\eta_{m-1}(n) \quad \text{Equation 3}$$

$$K_{f,m}(n) = K_{f,m}(n-1) - \frac{\gamma_{m-1}(n-1)\beta_{m-1}(n-1)}{B_{m-1}(n-1)}\eta_m(n) \quad \text{Equation 4}$$

-continued $$K_{b,m}(n) = K_{b,m}(n-1) - \frac{\gamma_{m-1}(n-1)\eta_{m-1}(n)}{F_{m-1}(n)}\beta_m(n) \quad \text{Equation 5}$$

$$\gamma_m(n-1) = \gamma_{m-1}(n-1) - \frac{\gamma_{m-1}^2(n-1)|\beta_{m-1}(n-1)|^2}{B_{m-1}(n-1)} \quad \text{Equation 6}$$

$$\xi_m(n) = \xi_{m-1}(n) - K_{m-1}(n-1)\beta_{m-1}(n) \quad \text{Equation 7}$$

$$K_{m-1}(n) = K_{m-1}(n-1) + \frac{\gamma_{m-1}(n)\beta_{m-1}(n)}{B_{m-1}(n)}\xi_m(n) \quad \text{Equation 8}$$

Where the filter coefficient updates are defined as follows:
$F_m(n)$ Weighted sum of forward prediction error squares for stage m at time n.
$B_m(n)$ Weighted sum of backward prediction error squares for stage m at time n.
$\eta_m(n)$ Forward prediction error.
$\beta_m(n)$ Backward prediction error.
$K_{b,m}(n)$ Backward reflection coefficient for stage m at time n.
$K_{f,m}(n)$ Forward reflection coefficient for stage m at time n.
$K_m(n)$ Joint process regression coefficient for stage m at time n.
$\gamma_m(n)$ Conversion factor for stage m at time n.
$\xi_m(n)$ A priori estimation error for stage m at time n.
$\lambda$ Exponential weighting factor or gain factor.

At stage zero, the RLSL 100 is supplied by signals u(n) 12 and d(n) 20. Subsequently, for each stage m, the above defined filter coefficient updates are recursively computed. For example at stage m and time n, the forward prediction error $\eta(n)$ 102 is the forward prediction error $\eta m-1$ (n) 103 of stage m−1 augmented by a combination of the forward reflection coefficient Kf,m−1(n−1) 104 with the delayed backward prediction error $\beta m-1$ (n) 105.

In a similar fashion, at stage m and time n, the backward prediction error $\beta m$ (n) 106 is the backward prediction error $\beta m-1$ (n) 105 of stage m−1 augmented by a combination of the backward reflection coefficient Kb,m(n−1) 107 with the delayed forward prediction error $\eta m-1$ (n) 103.

Moreover, a-priori estimation error backward $\xi m+1(n)$ 108, for stage m at time n, is the a priori estimation error backward $\xi m$ (n) 109 of stage m−1 reduced by a combination of the joint process regression coefficient Km−1(n−1) 110, of stage m−1 at time n−1, with the backward forward prediction error $\beta m-1$ (n) 105.

The adaptive filter 100 may be implemented using any suitable component or combination of components. In one embodiment, the adaptive filter is implemented using a DSP in combination with instructions and data stored in an associated memory. The DSP and memory may be part of any suitable system for speech processing or manipulation. The DSP and memory can be a stand-alone system or embedded in another system.

This RLSL algorithm requires extensive computational resources and can be prohibitive for embedded systems. As such, a mechanism for reducing the computational requirements of an RLSL adaptive filter 100 is obtained by reducing a number of calculated updates of the forward error prediction squares Fm(n) from backward error prediction squares Bm (n).

Typically, processors are substantially efficient at adding, subtracting and multiplying, but not necessarily at dividing. Most processors use a successive approximation technique to implement a divide instruction and may require multiple clock cycles to produce a result. As such, in an effort to reduce computational requirements, a total number of computations in the filter coefficient updates may need to be reduced as well as a number of divides that are required in the calculations of the filter coefficient updates. Thus, the RLSL algorithm filter coefficient updates are transformed to consolidate the divides. First, the time (n) and order (m) indices of the RLSL algorithm are translated to form Equation 9 through Equation 17.

$$F_m(n) = \lambda F_m(n-1) + \gamma_m(n-1)|\eta_m(n)|^2 \quad \text{Equation 9}$$

$$B_m(n) = \lambda B_m(n-1) + \gamma_m(n)|\beta_m(n)|^2 \quad \text{Equation 10}$$

$$\eta_m(n) = \eta_{m-1}(n) + K_{f,m}(n-1)\beta_{m-1}(n-1) \quad \text{Equation 11}$$

$$\beta_m(n) = \beta_{m-1}(n-1) + K_{b,m}(n-1)\eta_{m-1}(n) \quad \text{Equation 12}$$

$$K_{f,m}(n) = K_{f,m}(n-1) - \frac{\gamma_{m-1}(n-1)\beta_{m-1}(n-1)}{B_{m-1}(n-1)}\eta_m(n) \quad \text{Equation 13}$$

$$K_{b,m}(n) = K_{b,m}(n-1) - \frac{\gamma_{m-1}(n-1)\eta_{m-1}(n)}{F_{m-1}(n)}\beta_m(n) \quad \text{Equation 14}$$

$$\gamma_m(n) = \gamma_{m-1}(n) - \frac{\gamma_{m-1}^2(n)|\beta_{m-1}(n)|^2}{B_{m-1}(n)} \quad \text{Equation 15}$$

$$\xi_m(n) = \xi_{m-1}(n) - K_{m-1}(n-1)\beta_{m-1}(n) \quad \text{Equation 16}$$

$$K_m(n) = K_m(n-1) + \frac{\gamma_m(n)\beta_m(n)}{B_m(n)}\xi_{m+1}(n) \quad \text{Equation 17}$$

Then, the forward error prediction squares Fm(n) and the backward error prediction squares Bm(n) are inverted and redefined to be their reciprocals as shown in Equation 18, Equation 20 and Equation 21. Thus, by inverting Equation 9 we get:

$$\frac{1}{F_m(n)} = \frac{1}{\lambda F_m(n-1) + \gamma_m(n-1)|\eta_m(n)|^2} \quad \text{Equation 18}$$

Then redefine the forward error prediction squares Fm(n):

$$F' = \frac{1}{F} \quad \text{Equation 19}$$

Then insert into Equation 18 and simplify:

$$F'_m(n) = \frac{1}{\lambda \frac{1}{F'_m(n-1)} + \gamma_m(n-1)|\eta_m(n)|^2} = \quad \text{Equation 20}$$

$$\frac{F'_m(n-1)}{\lambda + F'_m(n-1)\gamma_m(n-1)|\eta_m(n)|^2}$$

By the same reasoning the backwards error prediction square Equation 10 becomes $$B'_m(n) = \frac{B'_m(n-1)}{\lambda + B'_m(n-1)\lambda_m(n)|\beta_m(n)|^2} \quad \text{Equation 21}$$

Further, new definitions for the forward and backward error prediction squares, F'm (n) and B'm(n), are inserted back into the remaining equations, Equation 13, Equation 14,
Equation 15, and Equation 17, to produce the algorithm coefficient updates as shown below in Equation 22 through Equation 30.

$$F'_m(n) = \frac{F'_m(n-1)}{\lambda + F'_m(n-1)\gamma_m(n-1)|\eta_m(n)|^2} \quad \text{Equation 22}$$

$$B'_m(n) = \frac{B'_m(n-1)}{\lambda + B'_m(n-1)\gamma_m(n)|\beta_m(n)|^2} \quad \text{Equation 23}$$

$$\beta_m(n) = \beta_{m-1}(n-1) + K_{b,m}(n-1)\eta_{m-1}(n) \quad \text{Equation 24}$$

$$K_{b,m}(n) = K_{b,m}(n-1) - \gamma_{m-1}(n-1)\eta_{m-1}(n)\beta_m(n)F'_{m-1}(n) \quad \text{Equation 25}$$

$$\eta_m(n) = \eta_{m-1}(n) + K_{f,m}(n-1)\beta_{m-1}(n-1) \quad \text{Equation 26}$$

$$K_{f,m}(n) = \quad \text{Equation 27}$$
$$K_{f,m}(n-1) - \gamma_{m-1}(n-1)\beta_{m-1}(n-1)\eta_m(n)B'_{m-1}(n-1)$$

$$\xi_m(n) = \xi_{m-1}(n) - K_{m-1}(n-1)\beta_{m-1}(n) \quad \text{Equation 28}$$

$$K_m(n) = K_m(n-1) + \gamma_m(n)\beta_m(n)\xi_{m+1}(n)B'_m(n) \quad \text{Equation 29}$$

$$\gamma_m(n) = \gamma_{m-1}(n) - \gamma'_{m-1}(n)|\beta_{m-1}(n)|^2 B'_{m-1}(n) \quad \text{Equation 30}$$

Figure 3:
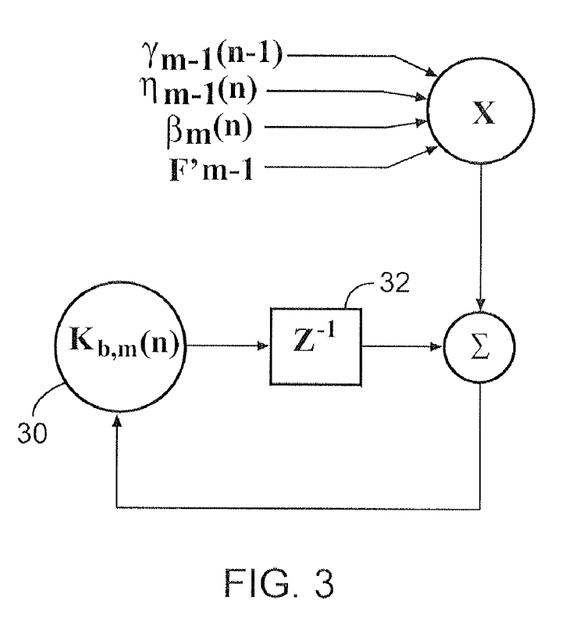
FIG. 3 is a block diagram of a backward reflection coefficient update of the adaptive filter of FIG. 2.

Now referring to FIG. 3, a block diagram of the backward reflection coefficient update Kb,m(n) 30 as evaluated in Equation 25 is shown. The block diagram of FIG. 3 is representative of, for example, a DSP operation or group of operations. The backward reflection coefficient update Kb,m(n) 30 is supplied to a delay 32 and the output of delay 32 Kb,m(n−1) is summed to a product of the forward error prediction squares F'm (n) with the backward prediction error βm(n), the forward prediction error ηm−1(n), and the conversion factor γm(n−1).

Figure 4:
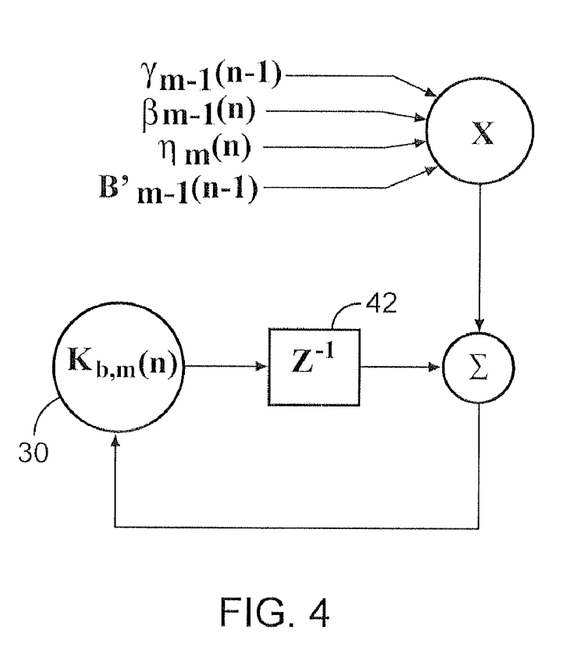
FIG. 4 is a block diagram of a forward reflection coefficient update of the adaptive filter of FIG. 2.

Now referring to FIG. 4, a block diagram of the forward reflection coefficient update Kf,m(n) 40 as evaluated in Equation 28 is shown. Similar to FIG. 3, the block diagram of FIG. 4 is representative of, for example, a DSP operation or group of operations. The backward reflection coefficient update Kb,m(n) 40 is supplied to a delay 42. The output of delay 42 Kf,m(n−1) is summed to a product of the backward error prediction squares B'm−1 (n−1) with the backward prediction error βm−1(n), the forward prediction error ηm(n), and the conversion faction γm−1(n−1).

Figure 5:
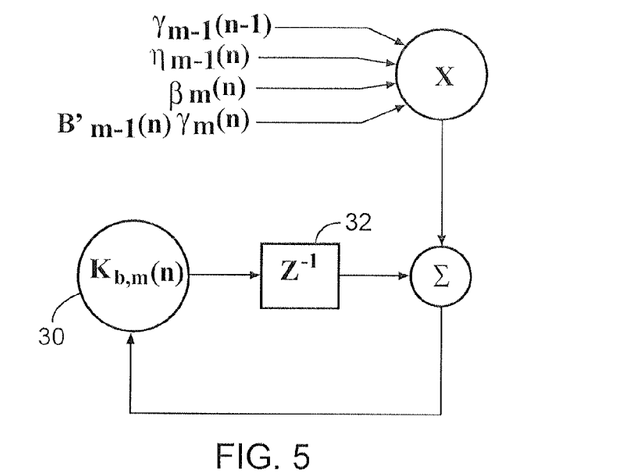
FIG. 5 is a graph illustrating backward error prediction squares for fifty samples of an input signal.
Figure 6:
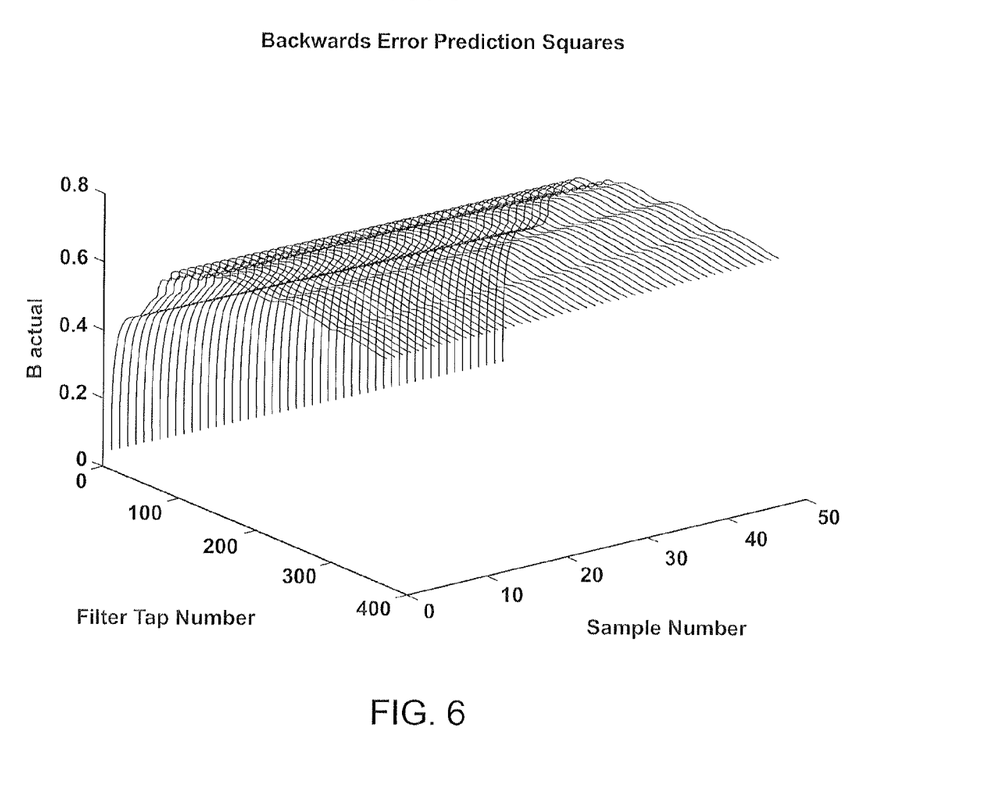
FIG. 6 is a graph illustrating forward error prediction squares for fifty samples of the input signal.
Figure 7:
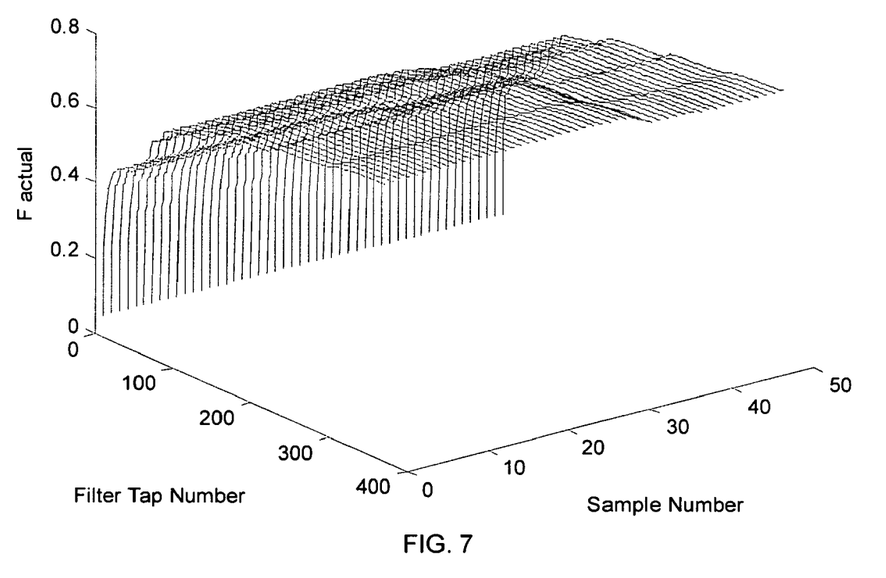
FIG. 7 is a graph illustrating echo return loss enhancements (ERLE) sing limited recursion for backward prediction.

In FIG. 5 and FIG. 6, the forward and backward error prediction squares, Fm (n) and Bm(n), are plotted against the length of the filter for 50 samples of input signal u(n) 12 during a condition of high convergence. These plots clearly indicate that the error prediction squares Fm (n) and Bm(n), ramp up quickly and then flatten out for the higher order taps of the adaptive filter 10. As such, one can infer that most of the information is substantially contained in the first few recursions of the RLSL algorithm and that a reduction in the number of coefficient updates can achieve acceptable filter performance.

Thus, a good mechanism for trading performance with computational requirements is to reduce the number of recursions or updates performed on the forward and backward error prediction squares, Fm (n) and Bm(n), to a predefined portion of the filter length. Then, the error prediction squares are held constant for the remainder of the filter tap updates. A minimal loss in a performance of the adaptive filter may result as the number of updates is decreased, but a gain in real-time performance can justify the minimal loss in filter performance.

Figure 8:
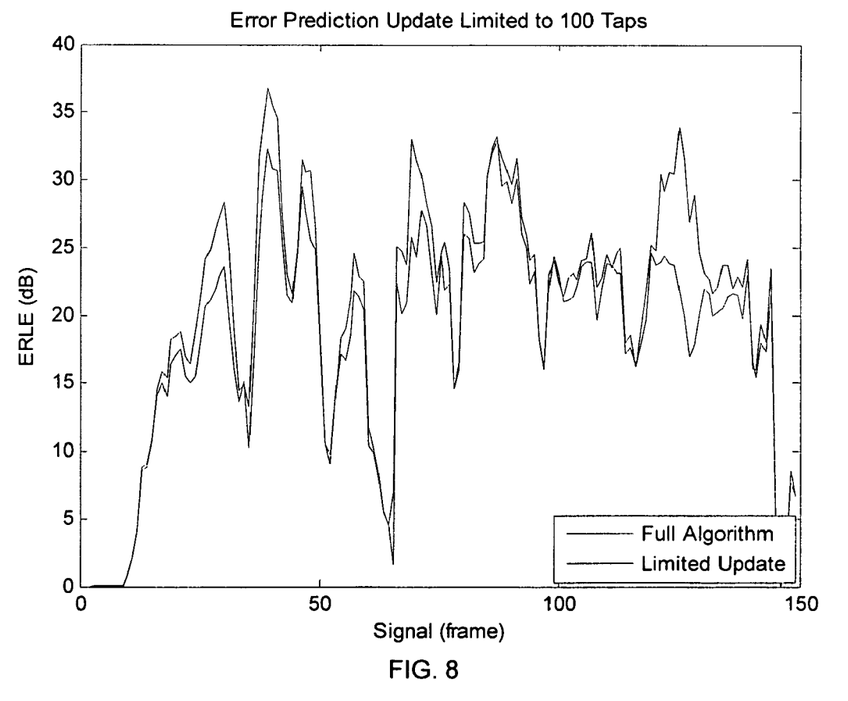
FIG. 8 is a graph illustrating a performance of the adaptive filter of FIG. 2 versus a number of recursions of backward error prediction squares updates.

FIG. 8 illustrates graphically the loss in performance of a 360 tap filter when the forward and backward error prediction squares, Fm (n) and Bm(n), are held constant after only 100 updates of the filter. This graph shows the echo return loss enhancement (ERLE) in dB of the filter for a 360 tap filter for both the full filter update and one with the error prediction updates calculated for only the first 100 taps of the 360 tap filter.

Figure 9:
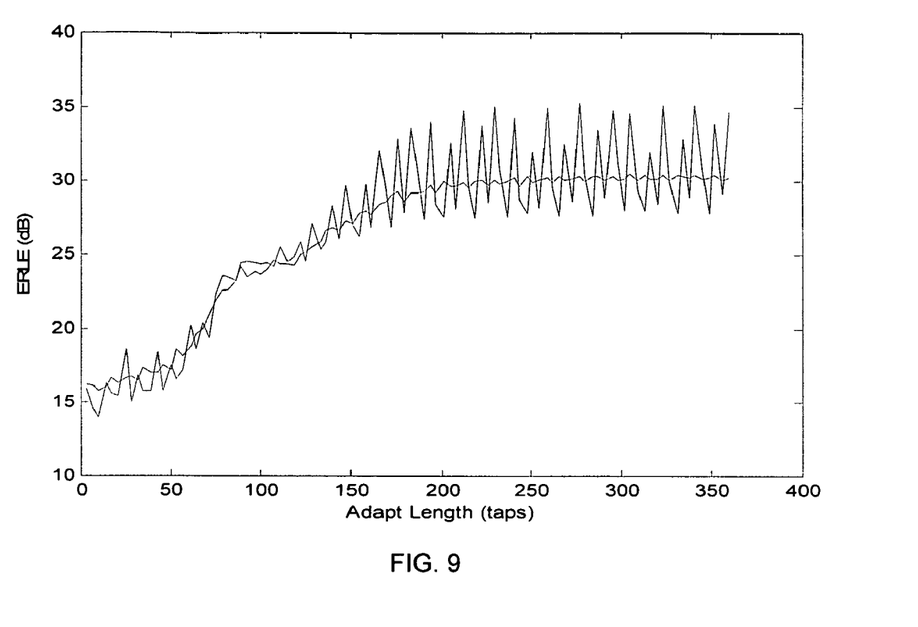
FIG. 9 is a graph illustrating measured timing requirements versus a number of forward and backward error prediction updates.

To generate the plot of FIG. 9, this process of limiting updates performed on the forward and backward error prediction squares, Fm (n) and Bm(n), to a predefined portion of the filter length was repeated for different limits applied to the number of error prediction updates and plotted against the ERLE of the adaptive filter 10. This plot of FIG. 9 shows how the filter performance degrades as the number of error prediction updates is reduced. Moreover, this FIG. 9 plot indicates that there is minimal improvement in filter performance in updating the error prediction squares beyond about 180 (half) filter taps.

Figure 10:
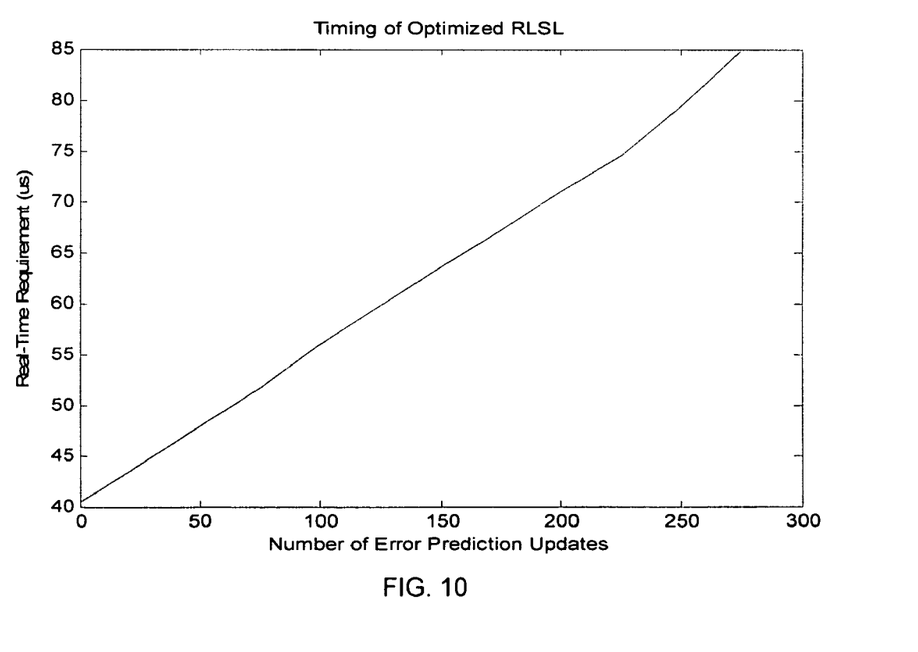
FIG. 10 is a graph illustrating measured timing requirements versus a number of forward and backward error prediction updates.

Now referring to FIG. 10, a graph illustrating measured timing requirements versus a number of forward and backward error prediction updates, Fm (n) and Bm(n). This FIG. 10 graph is included to serve as an aide in determining the proper trade-off between computational requirements and peak filter performance. This graph plots the measured timing requirements of the RLSL filter 10 vs. the number of forward and backward error prediction squares updated for a 360 tap length filter. These values reflect measurements taken on a real-time hardware implementation. As expected the timing decreases linearly as the number of updates is reduced.

In the final realization of the optimized RLSL algorithm, the recursion loop is broken into two parts. The first part is the full set of updates as shown in Equation 22 through Equation 30. These updates are performed as normal up to a predefined number of taps of the filter. The exact number of taps needed of course is determined by the trade off analysis between real time and filter performance. The second part of the optimized RLSL algorithm is given by Equation 31 through Equation 37. In these series of recursive updates, the forward and backward error prediction squares, Fm (n) and Bm(n), are held constant at the last value calculated from the first part of the optimized algorithm.

For the remaining filter updates the forward error prediction square term (Fc) remains constant and is used in Equation 32 to update the backward reflection coefficient Kb,m(n). Moreover, the backward error prediction square term (Bc) remains constant for the remainder of the filter updates and is used in Equation 34 to update the forward reflection coefficient Kf,m(n).

$$\beta_m(n) = \beta_{m-1}(n-1) + K_{b,m}(n-1)\eta_{m-1}(n) \quad \text{Equation 31}$$

$$K_{b,m}(n) = K_{b,m}(n-1) - \gamma_{m-1}(n-1)\eta_{m-1}(n)\beta_m(n)F_c \quad \text{Equation 32}$$

$$\eta_m(n) = \eta_{m-1}(n) + K_{f,m}(n-1)\beta_{m-1}(n-1) \quad \text{Equation 33}$$

$$K_{f,m}(n) = K_{f,m}(n-1) - \gamma_{m-1}(n-1)\beta_{m-1}(n-1)\eta_m(n)B_c \quad \text{Equation 34}$$

$$\xi_m(n) = \xi_{m-1}(n) - K_m(n-1)\beta_{m-1}(n) \quad \text{Equation 35}$$

$$K_m(n) = K_m(n-1) + \gamma_m(n)\beta_m(n)\xi_{m+1}(n)B_c \quad \text{Equation 36}$$

$$\gamma_m(n) = \gamma_{m-1}(n) - \gamma^2_{m-1}(n)|\beta_{m-1}(n)|^2 B_c \quad \text{Equation 37}$$

Figure 11:
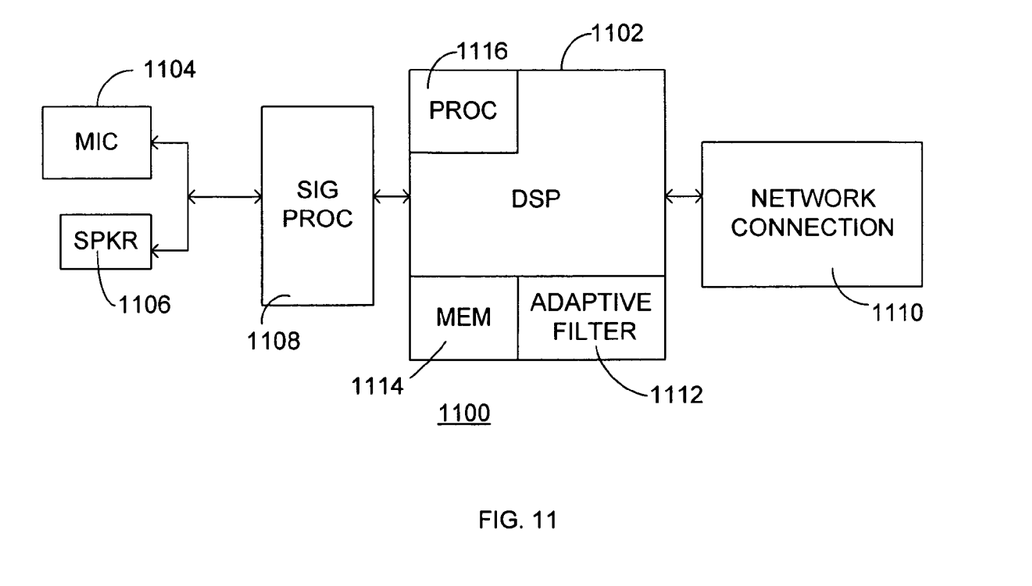
FIG. 11 is a block diagram of a communication device employing an adaptive filter.

FIG. 11 is a block diagram of a communication device 1100 employing an adaptive filter. The communication device 1100 includes a DSP 1102, a microphone 1104, a speaker 1106, an analog signal processor 1108 and a network connection 1110. The DSP 1102 may be any processing device including a commercially available digital signal processor adapted to process audio and other information.

The communication device 1100 includes a microphone 1104 and speaker 1106 and analog signal processor 1108. The microphone 1104 converts sound waves impressed thereon to electrical signals. Conversely, the speaker 1106 converts electrical signals to audible sound waves. The analog signal processor 1108 serves as an interface between the DSP, which operates on digital data representative of the electrical signals, and the electrical signals useful to the microphone 1104 and 1106. In some embodiments, the analog signal processor 1108 may be integrated with the DSP 1102.

The network connection 1110 provides communication of data and other information between the communication device 1100 and other components. This communication may be over a wire line, over a wireless link, or a combination of the two. For example, the communication device 1100 may be embodied as a cellular telephone and the adaptive filter 1112 operates to process audio information for the user of the cellular telephone. In such an embodiment, the network connection 1110 is formed by the radio interface circuit that communicates with a remote base station. In another embodiment, the communication device 1100 is embodied as a hands-free, in-vehicle audio system and the adaptive filter 1112 is operative to serve as part of a double-talk detector of the system. In such an embodiment, the network connection 1110 is formed by a wire line connection over a communication bus of the vehicle.

In the embodiment of FIG. 11, the DSP 1102 includes data and instructions to implement an adaptive filter 1112, a memory 1114 for storing data and instructions and a processor 1116. The adaptive filter 1112 in this embodiment is an RLSL adaptive filter of the type generally described herein. In particular, the adaptive filter 1112 is enhanced to reduce the number of calculations required to implement the RLSL algorithm as described herein. The adaptive filter 1112 may include additional enhancements and capabilities beyond those expressly described herein. The processor 1116 operates in response to the data and instructions implementing the adaptive filter 1112 and other data and instructions stored in the memory 1114 to process audio and other information of the communication device 1100.

In operation, the adaptive filter 1112 receives an input signal from a source and provides a filtered signal as an output. In the illustrated embodiment, the DSP 1102 receives digital data from either the analog signal processor 1108 or the network interface 1110. The analog signal processor 1108 and the network interface 1110 thus form means for receiving an input signal. The digital data is representative of a time-varying signal and forms the input signal. As part of audio processing, the processor 1116 of DSP 1102 implements the adaptive filter 1112. The data forming the input signal is provided to the instructions and data forming the adaptive filter. The adaptive filter 1112 produces an output signal in the form of output data. The output data may be further processed by the DSP 1102 or passed to the analog signal processor 1108 or the network interface 1110 for further processing.

The communication device 1100 may be modified and adapted to other embodiments as well. The embodiments shown and described herein are intended to be exemplary only.

It is therefore intended that the foregoing detailed description be regarded as illustrative rather than limiting, and that it be understood that it is the following claims, including all equivalents, that are intended to define the spirit and scope of this invention.

The invention claimed is:

1. A method for an m-stage recursive least squares lattice structure adaptive filter, the method comprising:

receiving an input signal at an interface of the adaptive filter;

recursively updating filter coefficients for each stage of the adaptive filter with a processor operative in conjunction with stored data and instructions for each stage of the adaptive filter, including reducing a number of updates of a forward error prediction squares and backward error prediction squares of the filter coefficients by performing the updates up to a predefined number of stages of the adaptive filter, and holding the forward error prediction squares and the backward error prediction squares constant during the remainder of the stages of the adaptive filter; and producing a filtered signal as an output signal of the adaptive filter at an interface of the adaptive filter.

2. The method of claim 1 wherein updating filter coefficients comprises limiting updating of the forward error prediction squares and the backward error prediction squares to a predefined portion of filter length.

3. The method of claim 2 wherein limiting updating of the forward error prediction squares and the backward error prediction squares to a predefined portion of the filter length comprises updating the forward error prediction squares and the backward error prediction squares of approximately one-half of all filter stages.

4. The method of claim 1 wherein receiving an input signal comprises receiving digital data representative of a time-varying signal.

5. A method for reducing computational complexity of an in-stage adaptive filter, the method comprising:

receiving an input signal at an input interface of the adaptive filter;

filtering the input signal by a processor operative in conjunction with stored data and instructions for each stage of the adaptive filter, to produce a filtered signal, including updating recursively a forward error prediction square term for a first portion of a length of the adaptive filter;

updating recursively a backward error prediction square term for the first portion of the length of the adaptive filter; and keeping the updated forward and backward error prediction square terms constant for a second portion of the length of the adaptive filter; and providing the filtered signal at an output interface of the adaptive filter.

6. The method of claim 5 wherein updating the forward error prediction square term comprises updating the forward error prediction square term for approximately one-half of the length of the adaptive filter and updating the backward error prediction square term comprises updating the backward error prediction square term for approximately one-half of the length of the adaptive filter.

7. The method of claim 5 wherein further comprising: updating all filter coefficients up to a predefined number of taps of the adaptive filter for a first set of filter updates; and holding constant the forward error prediction square term and the backward error prediction square term while updating the rest of the filter coefficients during a second set of filter updates.

8. The method of claim 7 further comprising: during the second set of filter updates, using the constant forward error prediction square term to update a backward reflection coefficient; and using the constant backward error prediction square term to update a forward reflection coefficient.

9. An m-stage adaptive filter comprising:

an interface to receive an input signal;

a processor operative in conjunction with stored data and instructions to recursively update filter coefficients for each stage of the adaptive filter while producing a filtered signal, the processor configured to reduce a number of updates of the forward error prediction squares and backward error prediction squares of the filter coefficients by performing the updates up to a predefined number of stages of the adaptive filter, and hold the forward error prediction squares and the backward error prediction squares constant during the remainder of the stages of the adaptive filter; and an interface to provide the filtered signal as an output signal.

10. The adaptive filter of claim 9 wherein the processor is operative to update recursively the forward error prediction squares for a first portion of a length of the adaptive filter; update recursively the backward error prediction squares for the first portion of the length of the adaptive filter; and keep the updated forward error prediction squares and backward error prediction squares constant for a second portion of the length of the adaptive filter.

11. The adaptive filter of claim 10 wherein the processor is operative to update all filter coefficients up to a predefined number of taps of the adaptive filter for a first set of filter updates; and hold constant the forward error prediction squares and the backward error prediction squares while updating the rest of the filter coefficients during a second set of filter updates.

* * * * *